United States Patent [19]
Holman et al.

[11] Patent Number: 6,005,776
[45] Date of Patent: Dec. 21, 1999

[54] VERTICAL CONNECTOR BASED PACKAGING SOLUTION FOR INTEGRATED CIRCUITS

[75] Inventors: Thomas J. Holman, Portland; Michael W. Leddige, Beaverton, both of Oreg.

[73] Assignee: Intel Corporation, Santa Clara, Calif.

[21] Appl. No.: 09/002,775

[22] Filed: Jan. 5, 1998

[51] Int. Cl.[6] .............................. H05K 1/16; H05K 1/18; H01L 23/12; H01L 23/488

[52] U.S. Cl. ........................... 361/760; 361/735; 361/803

[58] Field of Search ................................. 174/52.1, 52.4; 228/180.21; 257/686, 738, 685, 778, 777; 361/735, 749, 790, 744, 803, 784, 785; 439/68, 69, 61, 83; 438/66, 109, 106

[56] References Cited

U.S. PATENT DOCUMENTS

| | | | |
|---|---|---|---|
| 5,057,907 | 10/1991 | Ooi et al. ................................. | 257/686 |
| 5,229,916 | 7/1993 | Frankeny et al. ........................ | 361/749 |
| 5,517,754 | 5/1996 | Beilstein, Jr. et al. .................. | 257/777 |
| 5,530,623 | 6/1996 | Sanwo et al. ............................ | 361/785 |
| 5,604,377 | 2/1997 | Palagonia ................................. | 257/686 |
| 5,760,471 | 6/1998 | Fujisawa et al. ........................ | 257/686 |
| 5,828,125 | 10/1998 | Burns ....................................... | 257/777 |

*Primary Examiner*—Donald Sparks
*Attorney, Agent, or Firm*—Blakely, Sokoloff, Taylor & Zafman LLP

[57] ABSTRACT

An assembly featuring a substrate and a plurality of components. The plurality of components are packaged to be connected in a vertical orientation to the substrate. These components include (i) a vertical chip-scale package (CSP), (ii) an integrated circuit die and (iii) an interconnect. Including a plurality of connection leads, the vertical CSP contains the die which is generally situated along a vertical plane. The interconnect, capable of transferring information between the plurality of connection leads and the integrated circuit die, includes a first segment generally perpendicular to the vertical plane and connected to at least one connection lead. The interconnect further includes a second segment generally in parallel to the vertical plane and connected to the integrated circuit die.

15 Claims, 4 Drawing Sheets

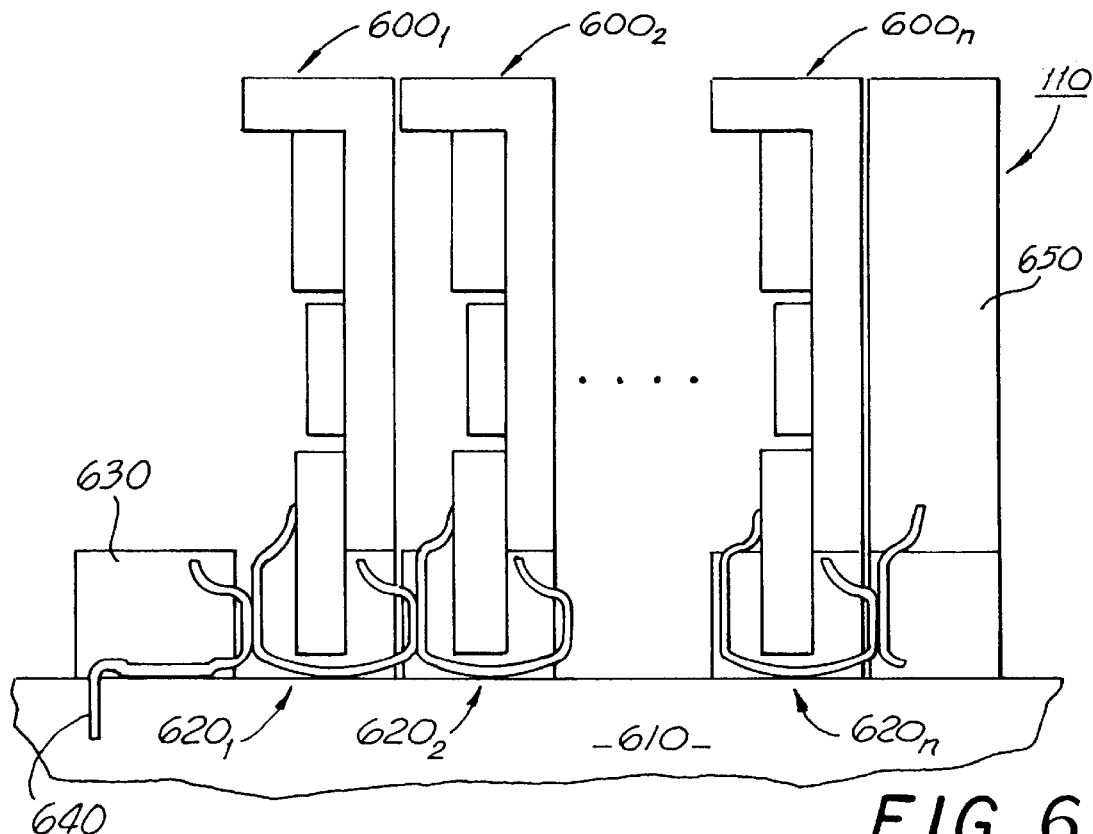
FIG. 6
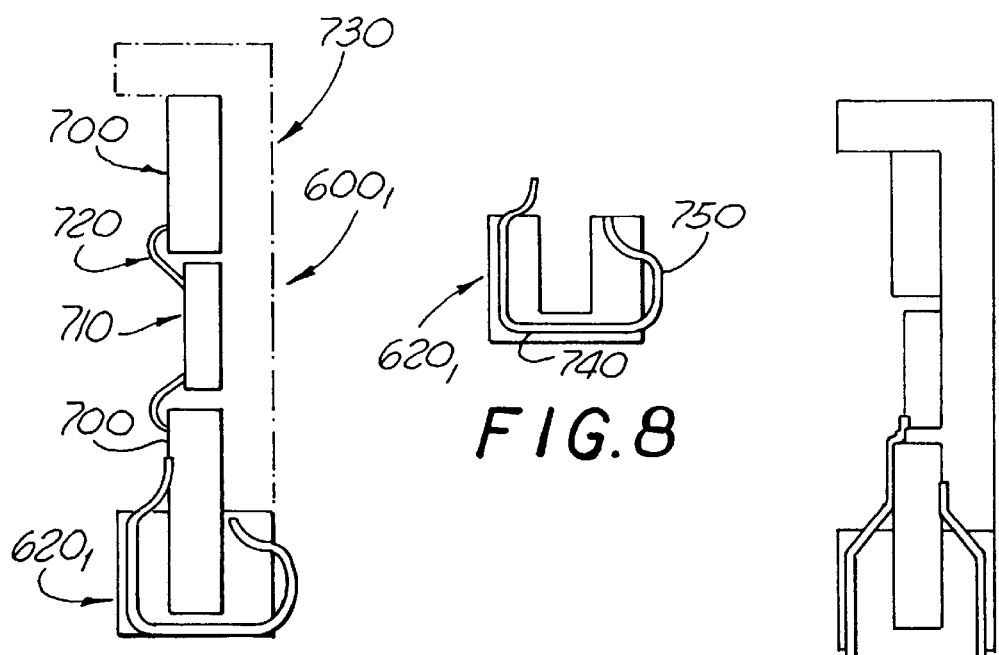
FIG. 7
FIG. 8
FIG. 9

6,005,776

VERTICAL CONNECTOR BASED PACKAGING SOLUTION FOR INTEGRATED CIRCUITS

BACKGROUND OF THE INVENTION

1. Field of the Invention

The present invention relates to the field of packaging for electrical components. In particular, the present invention relates to an assembly of components that support high bandwidth data transfer rates.

2. Description of Art Related to the Invention

For many years, electronic systems have been designed to include one or more circuit boards. Each circuit board features one or more transmission lines either routed on its surface or integrated between selectively patterned insulation and metal layers of the circuit board. Electronic hardware is placed on the surface of the circuit board and is appropriately connected to various transmission lines which provide signal communications and power.

One standard technique used for packaging components, particularly conventional dynamic random access memory (DRAM), is the use of horizontal chip-scale packages (CSPs). Horizontal CSPs offer a number of architectural advantages due to their small physical dimensions. For example, horizontal CSPs possess a low package inductance and may be arranged to meet minimum spacing constraints between integrated circuit (IC) devices. The reduction in spacing between components causes a lower impedance to be realized over the signal transmission lines used to connect the components. This lower impedance enhances the integrity of signals transmitted across these transmission lines.

Unfortunately, horizontal CSP technology does not provide optimal memory density and operating frequency for Direct Rambus DRAM (RDRAM®) designed by Rambus, Inc. of Mountain View, Calif. RDRAM® includes an interface for a high-speed interconnect in order to achieve high bandwidth data transfer rates. For example, conventional horizontal CSP packages can be as wide as twelve (12) millimeters (mm). This maximum CSP package size, combined with a spacing requirement of 2.5 mm between components on the same side of the circuit board to allow clearance for manufacturing and assembly, would result in an effective component pitch of 7.25 mm when components are placed on opposite sides of a circuit board. This pitch is too large for placement of thirty-two (32) RDRAMs on a single communication channel to achieve maximum operating frequency within a standard computer chassis. An optimal pitch spacing of approximately 2.5 mm would be necessary for electrical considerations and to implement a thirty-two (32) device communication channel with maximal operating frequency within existing computer chassis designs.

In addition, it is common practice to develop new components using larger die size technology. Over time, as the ICs designs are refined and improved, they are placed on smaller die size technology. This is done to reduce the package size in order to minimize the amount of circuit board surface area occupied by that package. For a horizontal CSP, as the die size is adjusted, the electrical effects on the signal transmission lines would also need to be adjusted because the length of the transmission lines would increase. This may require the chip layout for the circuit board to be modified as smaller die size technology is used or to risk adverse effects caused by enhanced impedance on the longer transmission lines.

Therefore, it is desirable to develop an IC assembly that uses a different packaging solution to overcome the disadvantages described above.

BRIEF SUMMARY OF THE INVENTION

One embodiment of the present invention relates to an assembly featuring a substrate and a plurality of components. The plurality of components are packaged to be connected in a vertical orientation to the substrate. These components include (i) a vertical chip-scale package (CSP), (ii) an integrated circuit die and (iii) an interconnect. Including a plurality of connection leads, the vertical CSP contains the die which is generally situated along a vertical plane. The interconnect, capable of transferring information between the plurality of connection leads and the integrated circuit die, includes a first segment generally perpendicular to the vertical plane and connected to at least one connection lead. The interconnect further includes a second segment generally in parallel to the vertical plane and connected to the integrated circuit die.

BRIEF DESCRIPTION OF THE DRAWINGS

The features and advantages of the present invention will become apparent from the following detailed description of the present invention in which:

FIG. 6 is an illustrative embodiment of an IC assembly of FIG. 1 featuring vertical CSPs using connector assemblies.

FIG. 7 is an embodiment of a vertical CSPs of FIG. 6.

FIG. 8 is a more detailed embodiment of the connector assembly of the vertical CSPs of FIG. 7.

FIG. 9 is an illustrative embodiment of another feature of the vertical CSPs including a ground plate connector as part of the connector assembly.

DETAILED DESCRIPTION OF THE PREFERRED EMBODIMENT

Herein, embodiments of an assembly having a packaging solution that supports high bandwidth data transfer rates are described. While numerous details are set forth to ensure understanding of the present invention, it is apparent to one skilled in the art that these specific details may not be required to practice the present invention.

Certain technology is frequently used to describe certain packaging hardware and characteristics. For example, an "assembly" is one or more components having integrated circuit (IC) devices placed in a packaging solution set forth as the present invention. These components may include, but are not limited or restricted to memory designed by Rambus, Inc. of Mountain View, Calif. A "substrate" is a selected medium that provides connectivity with the assembly. Certain types of substrates may include, but are not limited or restricted to circuit boards, removable daughter cards and the like.

In addition, an "electronic system" is broadly defined as any hardware product featuring an assembly configured in accordance with the present invention. Examples of electronic systems include computers (e.g., desktop, laptop, hand-held, server, etc.), wireless communication devices (e.g., cellular phones, cordless phones, pagers, etc.), a computer-related peripheral (e.g., printer, scanner, etc.) and the like. A "transmission line" is broadly defined as any medium capable of propagating information and/or various levels of power (e.g., ground, 3.3V, 5V, etc.). Examples of transmission lines may include a trace, one or more electrical wires routed loosely or placed in a protective sheath (cable), fiber optics and the like.

Figure 1:
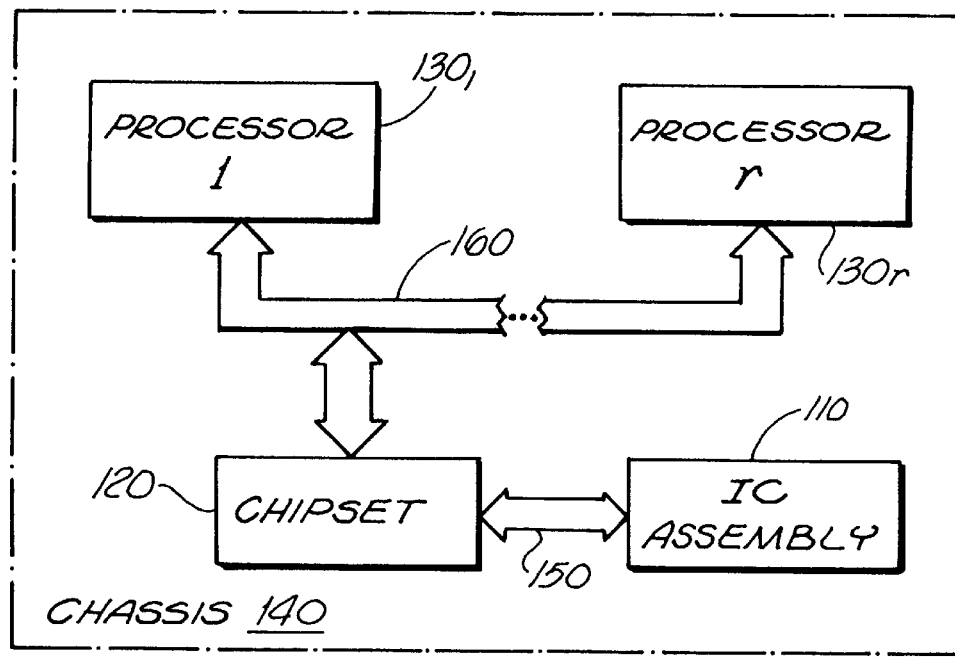
FIG. 1 is an illustrative embodiment of an electronic system including an IC assembly implemented with the present invention.

Referring to FIG. 1, one illustrative embodiment of an electronic system featuring an embodiment of the present invention is shown. The electronic system 100 includes an assembly 110, a chipset 120 and one or more processors $130_1$–$130_r$ ("r" is an arbitrary positive whole number), all of which are enclosed within a chassis 140 for protection against harmful environmental conditions. As shown, assembly 110 is connected to chipset 120 through a first transmission line 150 (e.g., memory bus) while processors $130_1$–$130_r$ are connected to chipset 120 through a second transmission line 160 (e.g., processor bus). It is contemplated, however, that the claimed packaging solution may be utilized for any component including processors $130_1$–$130_r$.

Figure 2:
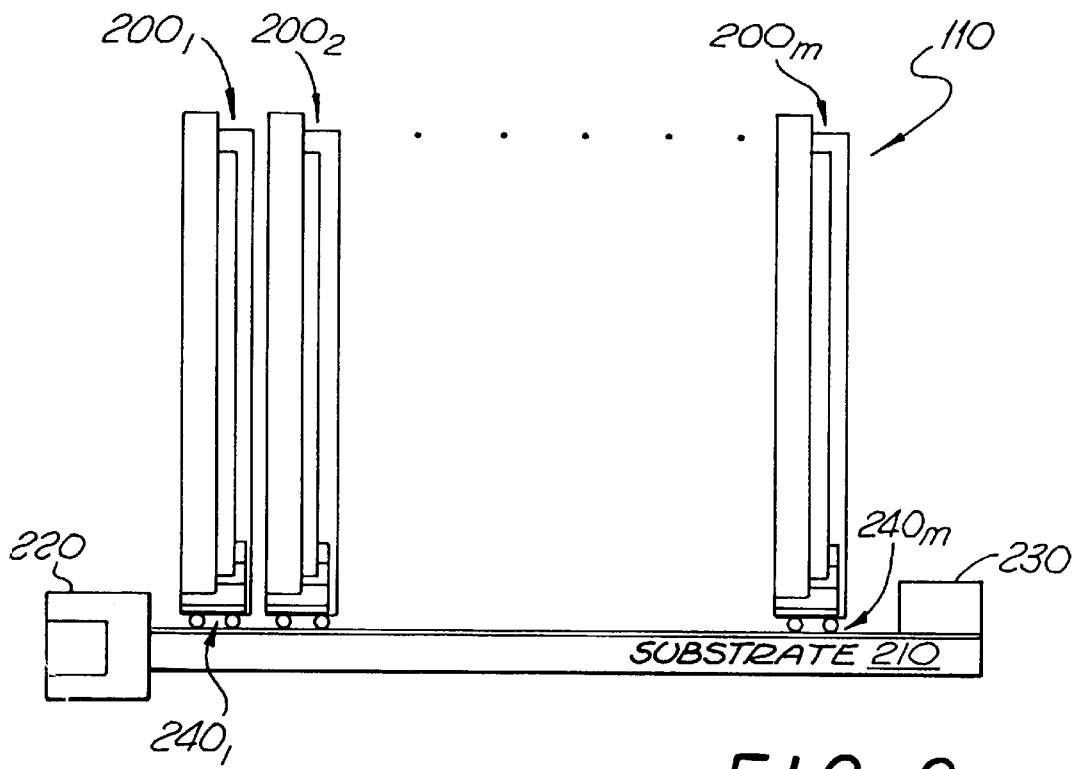
FIG. 2 is an illustrative embodiment of the IC assembly of FIG. 1 including a plurality of vertical chip-scale packages (CSPs).

As shown in FIG. 2, a first embodiment of assembly 110 is shown. Assembly 110 includes "m" components $200_1$–$200_m$ ("m" is a positive whole number) such as RDRAM® memory units. These components $200_1$–$200_m$ are placed in a selected vertical orientation for attachment to a substrate 210. This vertical orientation reduces the amount of substrate 210 occupied by each component $200_1$–$200_m$ so, in this embodiment, substrate 210 need only be approximately 28 millimeters (mm) long to support eight (8) components. Substrate 210 may be stationary (e.g., a motherboard) or removable (e.g., a memory module) as shown. A connector 220 and a terminator 230 are placed on substrate 210. The termination 230 may be removable to allow multiple assemblies (not shown) to be connected together to increase (i) the length of and (ii) the number of components connected to each communication channel.

Each component $200_1$–$200_m$ is connected to transmission lines through connection leads $240_1$–$240_m$, respectively. The transmission lines are placed on a surface of substrate 210 (microstrip-line) and/or are integrated in substrate 210 (strip-line). For example, a signal transmission line may be placed along a top surface of substrate 210 (microstrip-line) to propagate information signals while a power transmission line may be a ground plane (strip-line) or placed on a backside of substrate 210. This arrangement would provide a shorter flight time as compared to a complete strip-line implementation which may also be used.

As shown in FIG. 2, connection leads $240_1$–$240_m$ of components $200_1$–$200_m$ may include solder balls made of eutectic solder. Preferably, the diameter of each solder ball is approximately 0.02 inches (i.e., 20 mils) on 50 mil pitch to allow standard routing techniques such as approximately 35 mil via pads and standard printed circuit board (PCB) technology. For example, PCB technology may include "5/5 routing rules" which requires 5 mil spacing between each transmission line and neighboring connection leads. It is appreciated that other types of leads, different solder ball sizing or different solder compositions may be utilized as necessary.

Figure 3:
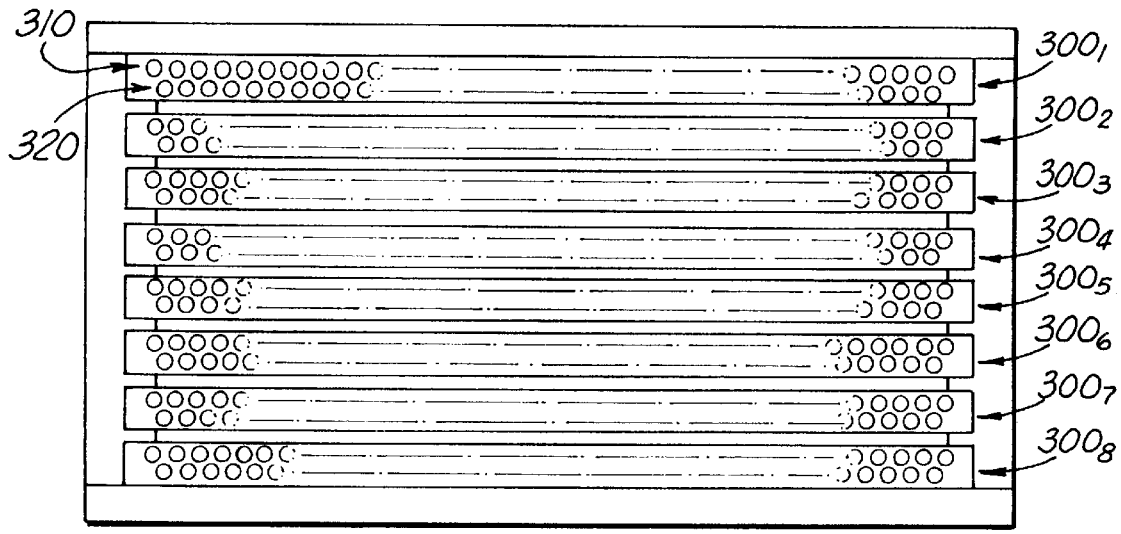
FIG. 3 is an illustrative land pattern utilized by the vertical CSPs of FIG. 2.
Figure 4:
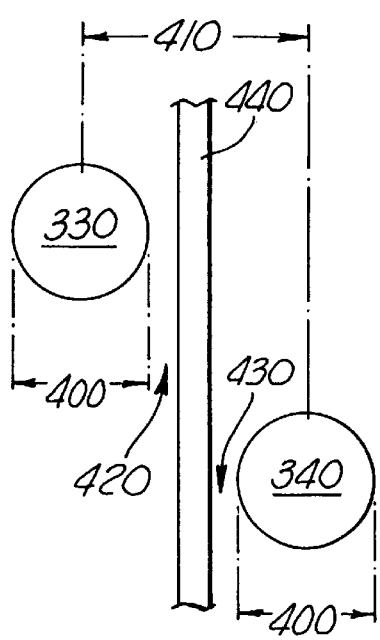
FIG. 4 is an illustrative embodiment of 5/5 routing utilized by a vertical package of FIG. 2.

Referring now to FIG. 3, multiple land patterns $300_1$–$300_8$ for use by a corresponding number of components $200_1$–$200_8$ (n=8) of FIG. 2 are illustrated. Each land pattern features two staggered rows of connection pads. For example, a first land pattern $300_1$ includes a first row of pads 310 and a second row of pads 320 which are staggered from the first row of pads 310. By providing only a pair of rows 310 and 320, this allows routing to be done completely on one side of the communication channel to eliminate the need for vias to change wiring layers. This would increase the usable frequency range through the use of micro-strip transmission lines. This staggered layout corresponds to the arrangement of connection leads $240_1$–$240_8$ (n=8) of FIG. 2, and thus, maintains a component spacing necessary to support conventional 5/5 routing as shown in FIG. 4. The staggered layout also provides mechanical stability of the components during reflow.

As further shown in FIG. 4, each of these connection pads (e.g., pad 330) is arranged with a predetermined diameter 400 and a predetermined spacing 410 from center-to-center between one or more staggered neighboring pads (e.g., pad 340). The spacing 410 is greater than diameter 400. For example, diameter 400 may be approximately 20 mils while spacing 410 is 35 mils. As a result, this diameter and spacing would provide sufficient (5 mil) spacing 420 and 430 between neighboring connection pads 330 and 340 for a transmission line 440 having a 5 mil width. As a result, conventional 5/5 routing can be used.

Figure 5:
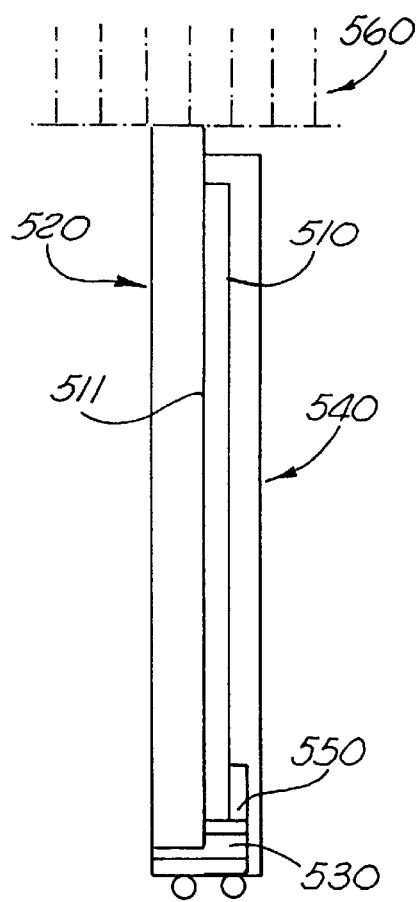
FIG. 5 is an illustrative embodiment of one of the vertical CSPs of FIG. 2.

Referring now to FIG. 5, each component $200_1$–$200_m$ of the assembly is packaged as a vertical chip-scale package (CSP) 500. Preferably, vertical CSP 500 possesses a selected height, a selected width determined by the number of communications channels used, and a thickness of approximately 2 mm. CSP 500 includes a die 510 and a heat spreader 520 situated on compliant material 530. The compliant material 530 is a non-conductive material (e.g., Kapton) which is generally smooth to reduce wear on an interconnect 550 caused from occasional movement of vertical CSP 500. The die 510 is partially covered with a protective encapsulation material 540 such as an epoxy-based compound, except along a vertical side 511 of die 510 that is placed in close proximity to heat spreader 520. Heat spreader 520 is a section of thermally conductive material (e.g., aluminum) designed to dissipate heat from die 510 by moving heat toward the sides of vertical CSP 500. Die 510 is in communication with transmissions lines of substrate 210 of FIG. 2 through a plurality of connection leads (described above) and interconnect 550.

The interconnect 550 is made of a flexible material which can be configured with a bend of approximately between 80 and 90 degrees to curve around compliant material 530 situated at a first end of both die 510 and heat spreader 520. Preferably, the material forming interconnect 550 is able to withstand temperatures exceeding normal soldering and wire bonding processes and possesses a low dielectric constant. Examples of the material forming interconnect 550 may include, but is not limited or restricted to a polymer. Interconnect 550 may be one-sided flexible tape or a two-sided, flexible tape that is tab-bonded to die 510. The "one-sided" interconnect would have signal and power transmission lines (e.g., ground lines) routed on a single side of the tape while a "two-sided" interconnect would have power transmission lines placed on a side opposite the signal transmission lines.

It is contemplated that a heat sink 560 may be situated in close proximity to a second end of heat spreader 520. The implementation of heat sink 560 is optional as represented by dashed lines.

Referring now to FIG. 6, a second embodiment of assembly 110 of FIG. 1 is shown. This embodiment provides appropriate electrical connections with the mechanical precision and stability of a connector solution. This approach is accomplished by using a prefabricated assembly (see FIG. 7) attached to a package of a component. This forms an IC-to-IC connection along a communication channel and an IC-to-substrate connections for signal isolation, low-speed signals and power delivery.

As shown in FIG. 6, assembly 110 includes "n" components $600_1$–$600_n$ ("n" is a positive whole number). These components (e.g., memory units) $600_1$–$600_n$ are placed in a selected vertical orientation to reduce the amount of substrate 610 occupied by each components $600_1$–$600_n$. Additionally, components $600_1$–$600_n$ are connected along one or more generally horizontal communication channels through corresponding connector assemblies $620_1$–$620_n$ described in detail in FIG. 7. A mating transmission structure 630 is attached to substrate 610 to form a communication channel 640 between one or more of these components $600_1$–$600_n$ or one of these components $600_1$–$600_n$ and another component placed on substrate 610. A removable terminator 650 provides a termination to all communication channel connections. This provides flexibility in the number of components placed in-line along substrate 610.

As shown in FIGS. 7 and 8, each connector assembly (e.g., assembly $620_1$) is a prefabricated structure that is attached to the end of a substrate supporting component $600_1$–$600_n$ or perhaps a component package itself. Component $600_1$ includes a die 710 attached to substrate 700 via flip chip technology or wire bonds 720 as shown. An optional heat sink 730 may be placed adjacent to die 710. Connector assembly $620_1$ includes a housing 740 and one or more contacts corresponding to the number of communication channels supported by component $600_1$. The housing 740 is made of an insulation material (e.g., a hardened plastic) that prevents neighboring contacts from shorting. Each contact (e.g., contact 750) is substantially contained in housing 740, but also partially extends outside housing 740 to at least connect to the next, successive component. As a result, a multi-component communication channels may be formed. A portion of contact 750 also extends outside housing 740 to attach connector assembly to substrate 700 by soldering, welding or another fastening technique.

Between each contact attached to substrate 710 is a ground plate 800 which connects to a mating connector 810 on substrate 610 in a vertical orientation as shown in FIGS. 8–9. Mating connector 810 may include a spring contact placed on a connector 820 mounted on substrate 610. The mating connector 810 is connected to a power transmission line such as a ground plane integrated in substrate 610. The ground plate 800 provides two benefits: (i) a low-impedance ground connection by minimizing inductance produced by current traveling along the ground plate and (ii) shielding between information signals. It is contemplated that a power plate, similar to ground plate 800, may be used for power delivery and low-speed signals.

Figure 10:
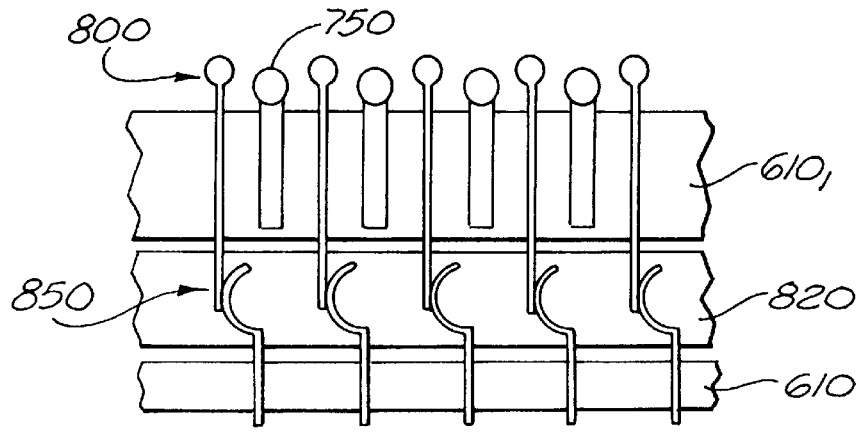
FIG. 10 is a cross-sectional view of the connector assembly of FIG. 9 attached to the substrate.
Figure 11:
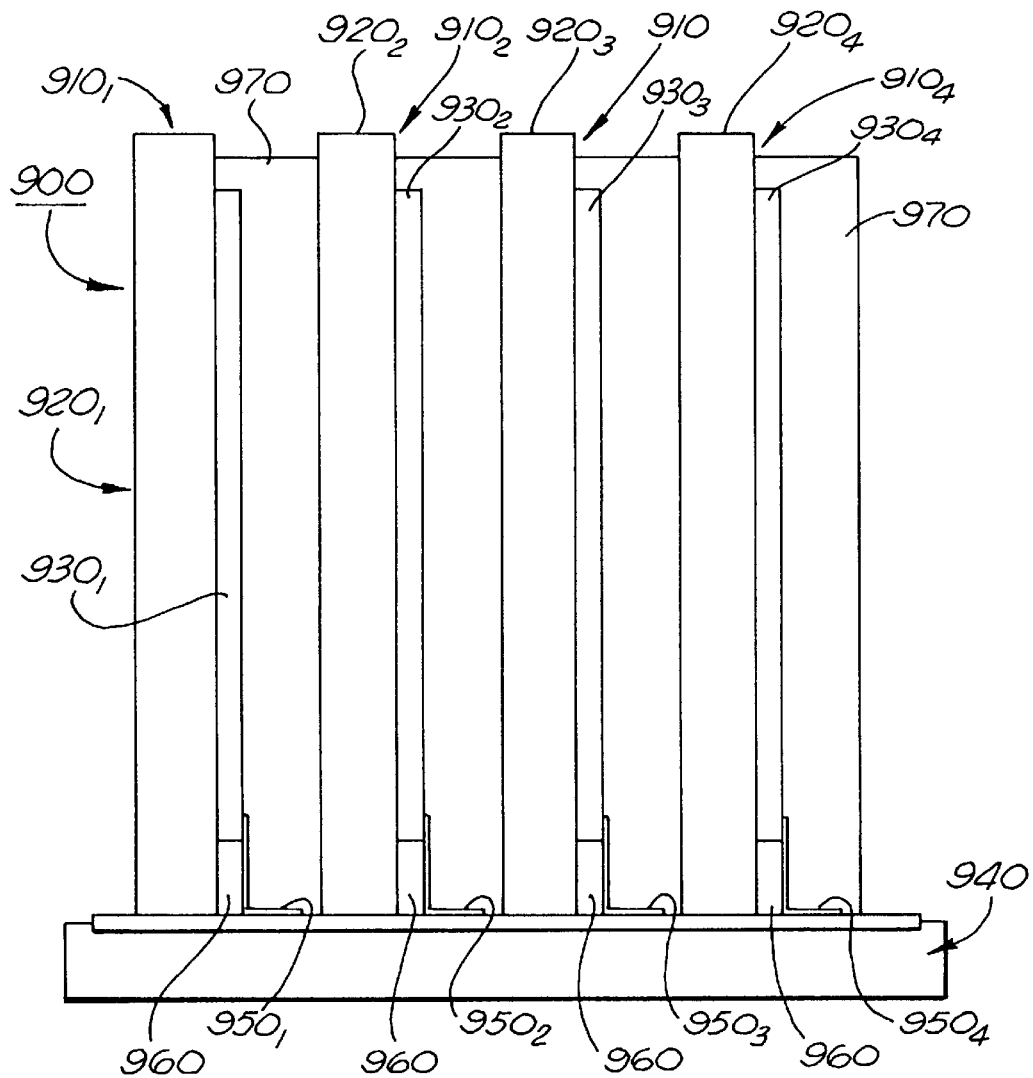
FIG. 11 is an illustrative embodiment of a vertical memory module for direct RDRAMs.

Referring to FIG. 10, a third embodiment of assembly 110 of FIG. 1 is shown as a vertical memory module (VMM) designed for Direct RDRAM® memory devices. As mentioned previously, Direct RDRAM® memory devices use high-speed communications to achieve high bandwidth data transfer rates. This results in a requirement for a tightly constrained electrical environment. Direct RDRAM® memory devices also require high density packaging with good thermal qualities, small upgrade granularity and low cost. A solution to these and the electrical requirements is to construct a memory module from vertically arranged devices.

In this embodiment, VMM 900 includes a number of memory units $910_1$–$910_4$ that form a memory structure, although any number of memory units may be used. Each of these memory units $910_1$–$910_4$ includes a heat spreader $920_1$–$920_4$ and a die $930_1$–$930_4$ raised above an underlying substrate 940 by compliant material 960 and connected to substrate 940 through corresponding interconnects $950_1$–$950_4$. For example, with respect to memory unit $910_1$, heat spreader $920_1$ is placed in close proximity to die $930_1$ which, in turn, is capable of being connected to substrate 940 via interconnect $950_1$. These interconnects $950_1$–$950_4$ are performed in accordance with "tab-on" technology which allows them to be situated at a generally right angle to the underlying substrate 940 and generally flush against compliant material 960.

Once each of the dice $930_1$–$930_4$ of VMM 900 are connected to substrate 940, an encapsulation material is applied to cover interconnects $950_1$–$950_4$ as well as their corresponding die $930_1$–$930_4$. This holds dice $930_1$–$930_4$ and heat spreaders $920_1$–$920_4$ in place. As a result, a stable and durable memory structure is provided.

The present invention described herein may be designed in accordance with many different configurations. While the present invention has been described in terms of various embodiments, other embodiments may come to mind to those skilled in the art without departing from the spirit and scope of the present invention. The invention should, therefore, be measured in terms of the claims which follow.

What is claimed is:

1. A component comprising:
   a package including a plurality of connection leads;
   an integrated circuit die contained in the package and generally situated along a vertical plane;
   an interconnect capable of transferring information between the plurality of connection leads and the integrated circuit die, the interconnect includes a first segment generally perpendicular to the vertical plane and connected to the at least one connection lead and a second segment generally in parallel to the vertical plane and connected to the integrated circuit die; and
   a compliant material upon which the integrated circuit die is situated and around which the interconnect is routed.

2. The component of claim 1, wherein the interconnect is a flexible tape tab-bonded to a front side of the integrated circuit die, the flexible tape includes at least one signal transmission line and at least one power transmission line placed along one side of the flexible tape.

3. The component of claim 1, wherein the interconnect is a two-sided flexible tape tab-bonded to a front side of the integrated circuit die, the flexible tape includes at least one signal transmission line routed on a first side of the flexible tape and at least one ground line routed on a second side of the flexible tape, the second side being opposite the first side.

4. The component of claim 1, wherein the plurality of connection leads are a plurality of solder balls arranged in staggered rows.

5. The component of claim 1 further comprising a heat spreader placed adjacent to a backside of the integrated circuit die.

6. An assembly comprising:
   a substrate; and
   a plurality of components connected to the substrate and packaged to be connected to the substrate in a vertical orientation, at least one of the plurality of components includes
   a vertical chip scale package including a plurality of connection leads, an integrated circuit die contained in the package and generally situated along a vertical plane, an interconnect capable of transferring information between the plurality of connection leads and the integrated circuit die, the interconnect includes a first segment generally perpendicular to the vertical plane and connected to the at least one connection lead and a second segment generally in parallel to the vertical plane and connected to the integrated circuit die, and a compliant material upon which the integrated circuit die is situated and around which the interconnect is routed.

7. The assembly of claim 6, wherein the substrate includes a removable daughter card having a plurality of transmission lines to establish communications between the plurality of components.

8. The assembly of claim 7, wherein the plurality of transmission lines are routed in accordance with standard printed circuit board technology.

9. The assembly of claim 6, wherein the substrate includes a connector and a removable terminator.

10. The assembly of claim 6, wherein:

the substrate includes a plurality of connection pads arranged in staggered rows; and the connection leads are arranged in staggered rows in alignment with the plurality of connection pads.

11. The assembly of claim 10, wherein the interconnect of the at least one of the plurality of components includes a flexible tape tab-bonded to a front side of the integrated circuit die, the flexible tape includes at least one signal transmission line and at least one power transmission line placed along one side of the flexible tape.

12. The assembly of claim 10, wherein the interconnect of the at least one of the plurality of components includes a two-sided flexible tape tab-bonded to a front side of the integrated circuit die, the flexible tape includes at least one signal transmission line routed on a first side of the flexible tape and at least one ground line routed on a second side of the flexible tape, the second side being opposite the first side.

13. An electronic system comprising:

a chipset; and an assembly connected to the chipset, the assembly including a substrate; and a plurality of components connected to the substrate and packaged to be connected to the substrate in a vertical orientation, at least one of the plurality of components includes a vertical chip scale package including a plurality of connection leads, an integrated circuit die contained in the package and generally situated in a vertical plane, an interconnect capable of transferring information between the plurality of connection leads and the integrated circuit die, the interconnect includes a first segment generally perpendicular to the vertical plane and connected to the at least one connection lead and a second segment generally in parallel to the vertical plane and connected to the integrated circuit die, and a compliant material upon which the integrated circuit die is situated and around which the interconnect is routed.

14. An assembly comprising:

a substrate; and a vertical memory module attached to the substrate, the vertical memory module including a plurality of components arranged in a vertical orientation, each of the plurality of components including:

a compliant material, an integrated circuit die situated on the compliant material, a heat spreader adjacent to a first side of the integrated circuit die, and an interconnect coupled to the integrated circuit die and the substrate and routed around the compliant material, the interconnect including a first segment configured to be substantially in parallel with the integrated circuit die and a second segment configured to be substantially flush against the substrate; and an encapsulation material covering each integrated circuit die and interconnect of the plurality of components in their entirety and a substantial portion of each heat spreader of the plurality of components.

15. The system of claim 14, wherein:

the substrate includes a plurality of connection pads arranged in staggered rows; and the vertical memory module includes a plurality of connection leads arranged in staggered rows in alignment with the plurality of connection pads.

* * * * *

UNITED STATES PATENT AND TRADEMARK OFFICE
CERTIFICATE OF CORRECTION

PATENT NO. : 6,005,776
DATED : December 21, 1998
INVENTOR(S) : Holman, et al.

It is certified that error appears in the above-identified patent and that said Letters Patent is hereby corrected as shown below:

In column 2 at line 57 after "Certain" delete "technology" and insert --terminology--.

In column 5 at line 27 after "$600_1$" delete "$-600_n$".

Signed and Sealed this

Fifth Day of September, 2000

Q. TODD DICKINSON

Attest:

Attesting Officer

Director of Patents and Trademarks